United States Patent
Jang et al.

(10) Patent No.: US 9,470,379 B2
(45) Date of Patent: Oct. 18, 2016

(54) DISPLAY APPARATUS

(71) Applicant: SAMSUNG ELECTRONICS CO., LTD., Suwon-si (KR)

(72) Inventors: Kyoung Choul Jang, Suwon-si (KR); Heong Seog Lee, Hwaseong-si (KR); Keun Bae Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 149 days.

(21) Appl. No.: 14/193,536

(22) Filed: Feb. 28, 2014

(65) Prior Publication Data

US 2014/0313116 A1    Oct. 23, 2014

Related U.S. Application Data

(60) Provisional application No. 61/770,740, filed on Feb. 28, 2013.

(30) Foreign Application Priority Data

Jul. 24, 2013    (KR) .................. 10-2013-0087514

(51) Int. Cl.
| | | |
|---|---|---|
| *H05K 5/00* | (2006.01) |
| *G02F 1/13357* | (2006.01) |
| *F21K 99/00* | (2016.01) |
| *G02F 1/1333* | (2006.01) |
| *G02F 1/1335* | (2006.01) |

(52) U.S. Cl.
CPC ........... *F21K 9/30* (2013.01); *G02F 1/133308* (2013.01); *G02F 1/133603* (2013.01); *H05K 5/0026* (2013.01); *G02F 2001/133317* (2013.01); *G02F 2001/133607* (2013.01); *G02F 2001/133612* (2013.01); *G02F 2201/54* (2013.01)

(58) Field of Classification Search
CPC ............... F21K 9/30; G02F 1/133308; G02F 1/133603; G02F 2001/133317; G02F 2001/133607; G02F 2001/133612; G02F 2201/54; G06F 1/1601
See application file for complete search history.

(56) References Cited

U.S. PATENT DOCUMENTS

| | | | | |
|---|---|---|---|---|
| 8,184,230 | B2 * | 5/2012 | Schaeffer .......... | G02F 1/133603 349/58 |
| 8,721,151 | B2 * | 5/2014 | Wang .................. | G02B 6/0038 362/612 |

(Continued)

FOREIGN PATENT DOCUMENTS

| | | |
|---|---|---|
| EP | 2434196 A1 | 3/2012 |
| JP | 2013-012400 A | 1/2013 |
| KR | 10-2011-0117579 A | 10/2011 |
| KR | 10-2012-0140075 A | 12/2012 |
| KR | 10-2013-0019899 A | 2/2013 |

OTHER PUBLICATIONS

International Search Report for PCT/KR2014/001510 dated May 27, 2014 [PCT/ISA/210].
Communication dated Apr. 12, 2016, from the European Patent Office in counterpart European Application No. 14757397.6.

*Primary Examiner* — Alan Cariaso
(74) *Attorney, Agent, or Firm* — Sughrue Mion, PLLC

(57) ABSTRACT

A display apparatus having a display panel and a backlight to radiate light to the display panel is provided, The backlight includes a plurality of printed circuit boards disposed in an even manner and a plurality of light emitting diodes mounted on the plurality of printed circuit boards. Thus a backlight proper for a large display panel may be provided.

8 Claims, 11 Drawing Sheets

(56) References Cited

U.S. PATENT DOCUMENTS

| | | | |
|---|---|---|---|
| 8,794,778 B2 * | 8/2014 | Yoo | G06F 1/16 362/633 |
| 8,858,007 B2 * | 10/2014 | Kim | H05K 1/0203 362/613 |
| 8,879,021 B2 * | 11/2014 | Kim | G02F 1/13308 349/149 |
| 9,104,064 B2 * | 8/2015 | Takeuchi | G02B 5/0236 |
| 2009/0135583 A1 | 5/2009 | Hillman et al. | |
| 2011/0084956 A1 * | 4/2011 | Choi | G02F 1/133603 345/212 |
| 2011/0164401 A1 * | 7/2011 | Choi | G02B 6/0083 362/97.1 |
| 2012/0099049 A1 * | 4/2012 | Yamazaki | G02F 1/133603 349/64 |

* cited by examiner

DISPLAY APPARATUS

CROSS-REFERENCE TO RELATED APPLICATION

This application claims priority from Korean Patent Applications No. 2013-0087514, filed on Jul. 24, 2013, and U.S. 61/770,740, filed on Feb. 28, 2013, in the Korean Intellectual Property Office, the disclosure of which are incorporated herein by reference, in their entireties.

BACKGROUND

1. Field

Exemplary embodiments relate to a display apparatus having a display panel on which a screen is displayed.

2. Description of the Related Art

A display apparatus represents an apparatus having a display on which an image is displayed. As for the display apparatus, as such, a television or a monitor is included.

The display apparatus, as such, includes a display panel on which an image is displayed and a backlight configured to radiate light to the display panel.

The display apparatus, as such, is in a trend of gradually becoming larger in size in recent years. Accordingly, a display panel having a large size thereof and a backlight having an area that corresponds to the large size display panel, are needed, and a structure to support the large size display panel and the backlight is needed.

SUMMARY

Therefore, an aspect of the exemplary embodiments provides a display apparatus having a structure suitable for a large display panel.

Additional aspects of the exemplary embodiments will be set forth in part in the description which follows and, in part, will be obvious from the description, or may be learned by practice of the exemplary embodiments.

In accordance with one aspect of the exemplary embodiments, a display apparatus includes a display panel, and a backlight. The backlight may be configured to radiate light to the display panel. The backlight may include a plurality of printed circuit boards disposed in an even manner, and a plurality of light emitting diodes mounted on the plurality of printed circuit boards.

The plurality of printed circuit boards may be provided in a plurality of rows arranged in left side and right side directions and a plurality of columns arranged in upper and lower side directions.

The display apparatus may further include a panel shaped member configured to support rear surfaces of the plurality of printed circuit boards.

The display apparatus may further include a middle mold, a bottom chassis and a supporting member. The middle mold may be configured to support the display panel. The bottom chassis may be configured to accommodate the backlight. The supporting member may be disposed between the middle mold and the bottom chassis. The supporting member may include a backlight supporting portion having a thickness which is the same as a thickness of the panel shaped member and disposed between a periphery of the backlight and the bottom chassis. The panel shaped member may have a honeycomb structure formed between a pair of aluminum panels.

The display apparatus may further include a top chassis, a side surface case and a rear surface case. The top chassis may be configured to maintain the display panel in a state of being installed at the middle mold. The side surface case may have a quadrangular ring shape and may be provided to cover upper and lower sides and left and right sides of the bottom chassis and the top chassis. The rear surface case may be provided to cover a rear side of the side surface case.

The display apparatus may further include a plurality of boards disposed at a rear surface of the bottom chassis.

The plurality of boards may include a power supply board, a signal processing board, a power supply board connected to an external power source in order to supply power to the display apparatus, a signal processing board configured to process image signals and an acoustic signals, at least one panel driving board configured to control a driving of the display panel, and a backlight driving board configured to control a driving of the backlight.

The at least one panel driving board may include a pair of panel driving boards each disposed at an upper portion and at a lower portion of the backlight driving board. The panel driving board disposed at the upper portion of the backlight driving board may be configured to control driving of an upper domain of the display panel, while the panel driving board disposed at the lower portion of the backlight driving board may be configured to control driving of a lower domain of the display panel.

The power supplying board may be disposed at one side of the backlight driving board. The signal processing board may be disposed at the other side of the backlight driving board.

In accordance with another aspect of the present disclosure, a display apparatus includes a display panel, and a plurality of panel driving boards configured to divide the display panel into a plurality of domains for driving the apparatus.

As described above, a display apparatus includes a plurality of printed circuit boards disposed in an even manner and light emitting diodes mounted on the plurality of printed circuit boards, thereby easily providing a backlight which corresponds to a large display apparatus.

In addition, the display apparatus includes a plurality of panel driving boards configured to divide a display panel into a plurality of domains for driving the apparatus, and thus, a large size display panel may be driven.

An aspect of an exemplary embodiment may provide a display apparatus including: a display panel; a backlight comprising a plurality of printed circuit boards; and a panel shaped member configured to support rear surfaces of the plurality of printed circuit boards.

The display apparatus may further include a plurality of light emitting diodes mounted on the plurality of printed circuit boards.

The display apparatus may further include a bottom chassis configured to accommodate the backlight.

The display apparatus may additionally include a plurality of panel driving boards configured to divide the display panel into a plurality of domains for driving the display panel.

The plurality of printed circuit boards may be provided in a plurality of rows arranged left and right side directions and a plurality of columns arranged in upper and lower side directions.

BRIEF DESCRIPTION OF THE DRAWINGS

These and/or other aspects of the disclosure will become apparent and more readily appreciated from the following description of the exemplary embodiments, taken in conjunction with the accompanying drawings of which.

DETAILED DESCRIPTION

Figure 1:
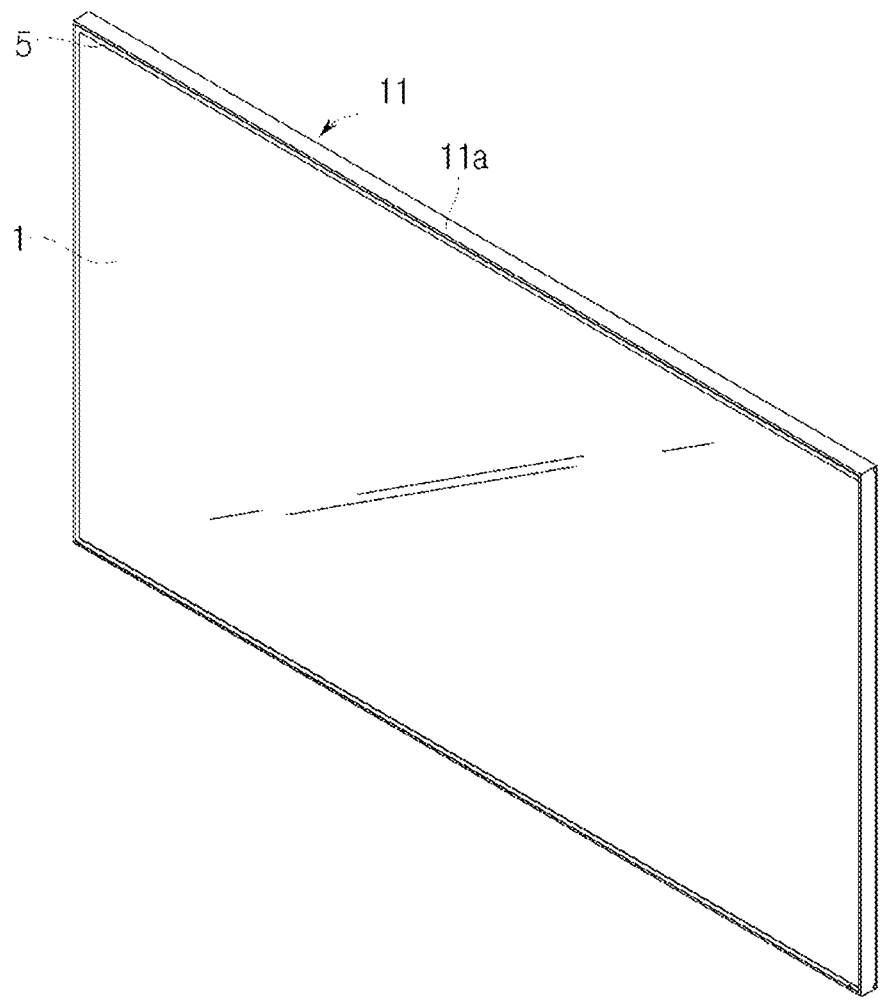
FIG. 1 is a perspective view of a front of a display apparatus in accordance with one exemplary embodiment.
Figure 2:
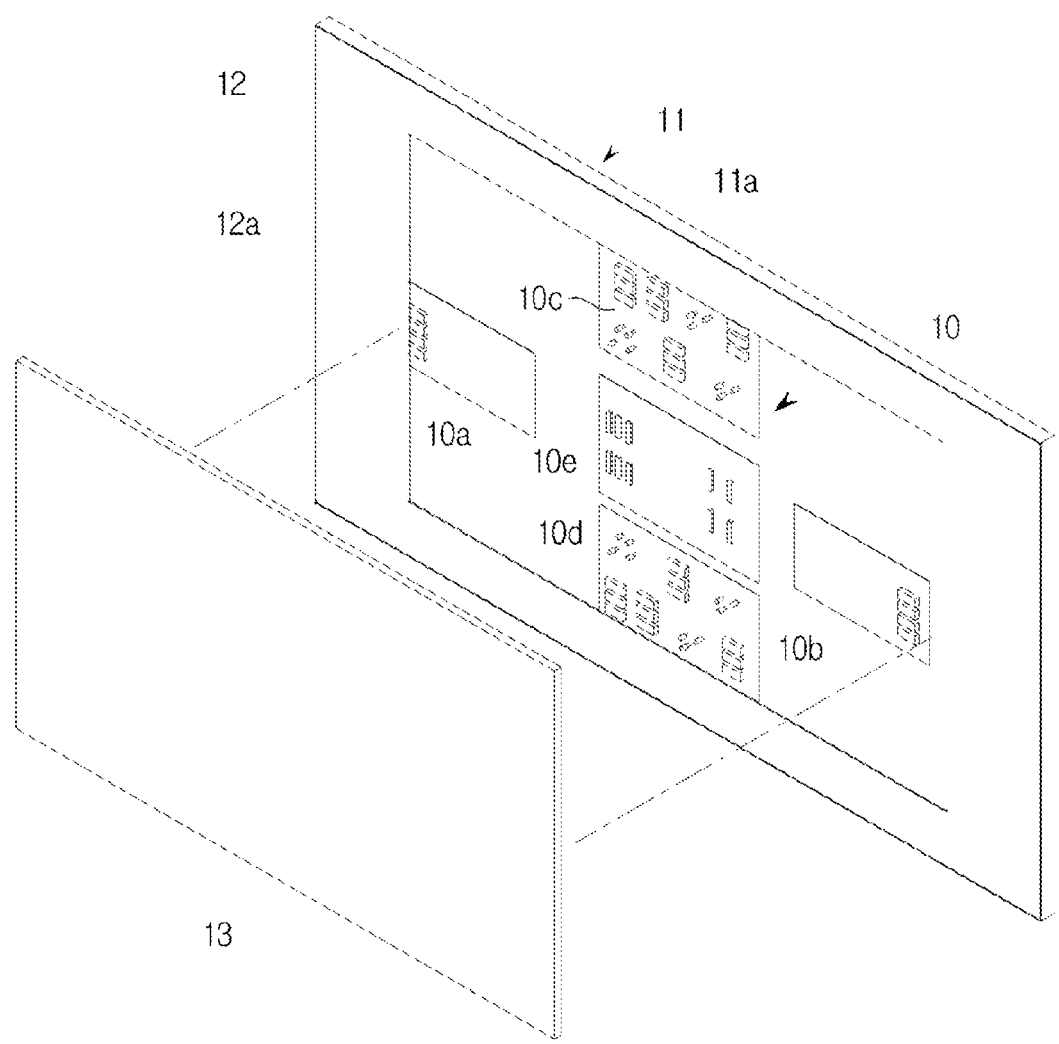
FIG. 2 is a perspective view of a rear of the display apparatus in accordance with one exemplary embodiment.
Figure 3:
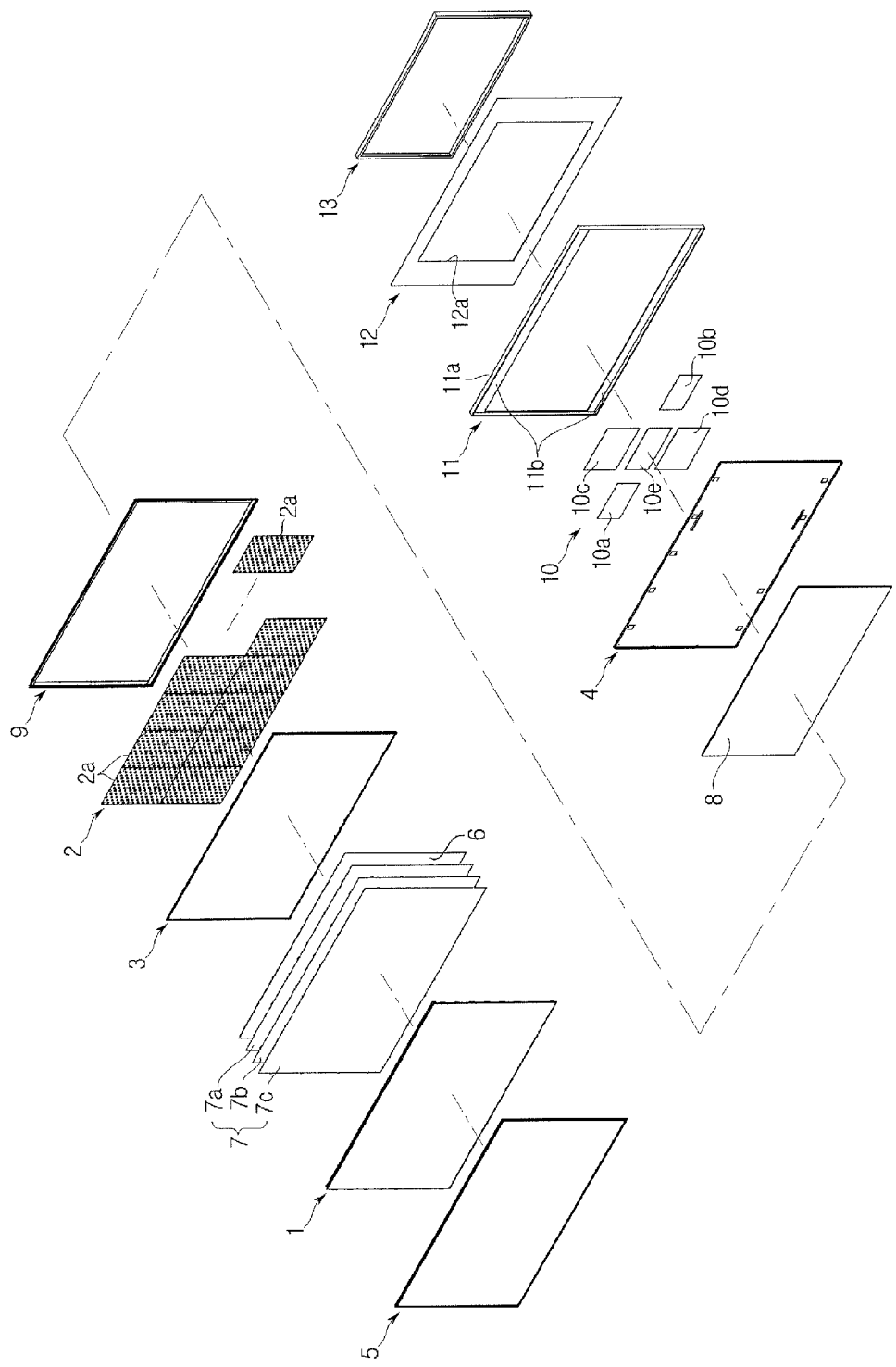
FIG. 3 is an exploded perspective view of a front of the display apparatus in accordance with one exemplary embodiment.
Figure 4:
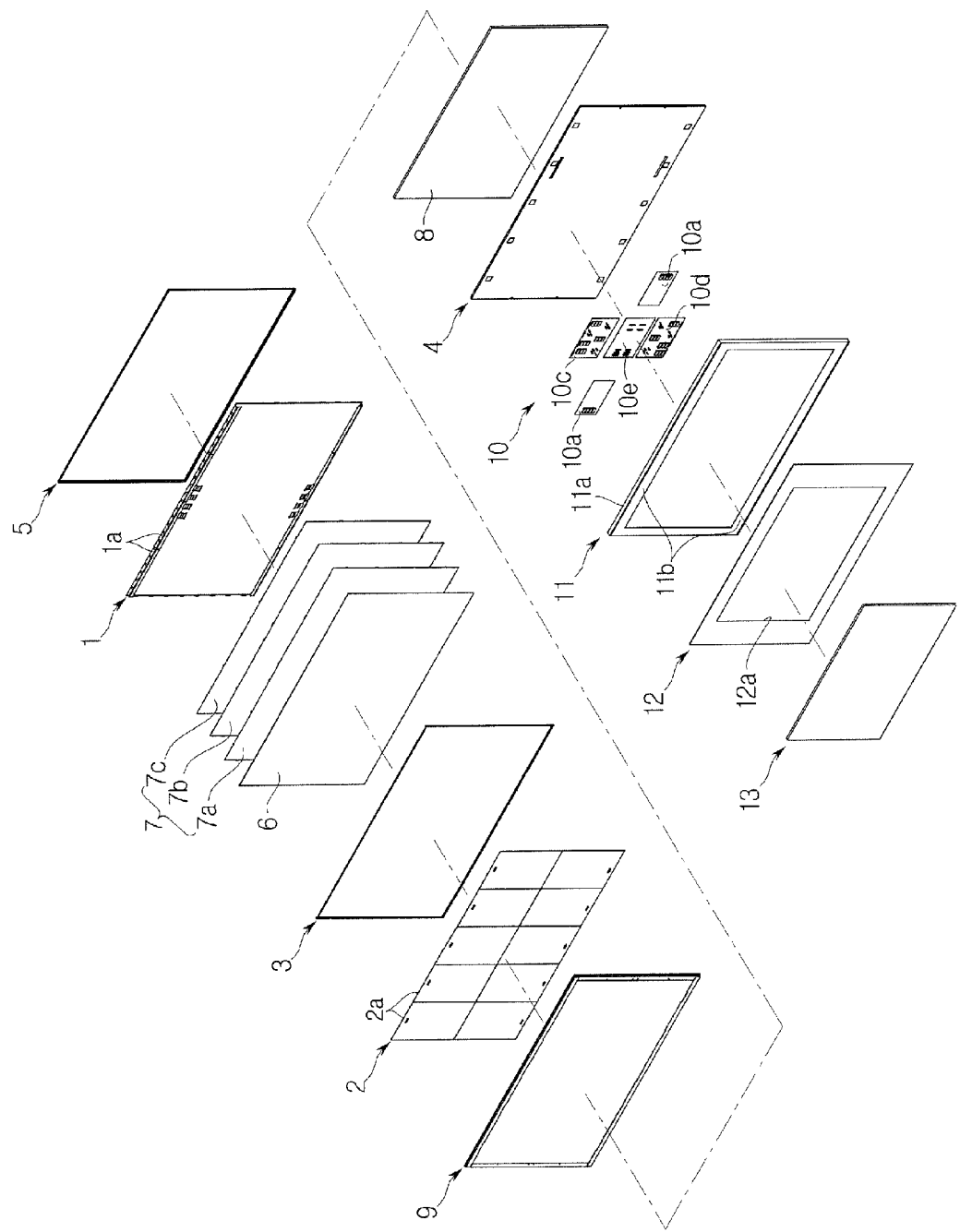
FIG. 4 is an exploded perspective view of a rear of the display apparatus in accordance with one exemplary embodiment.
Figure 5:
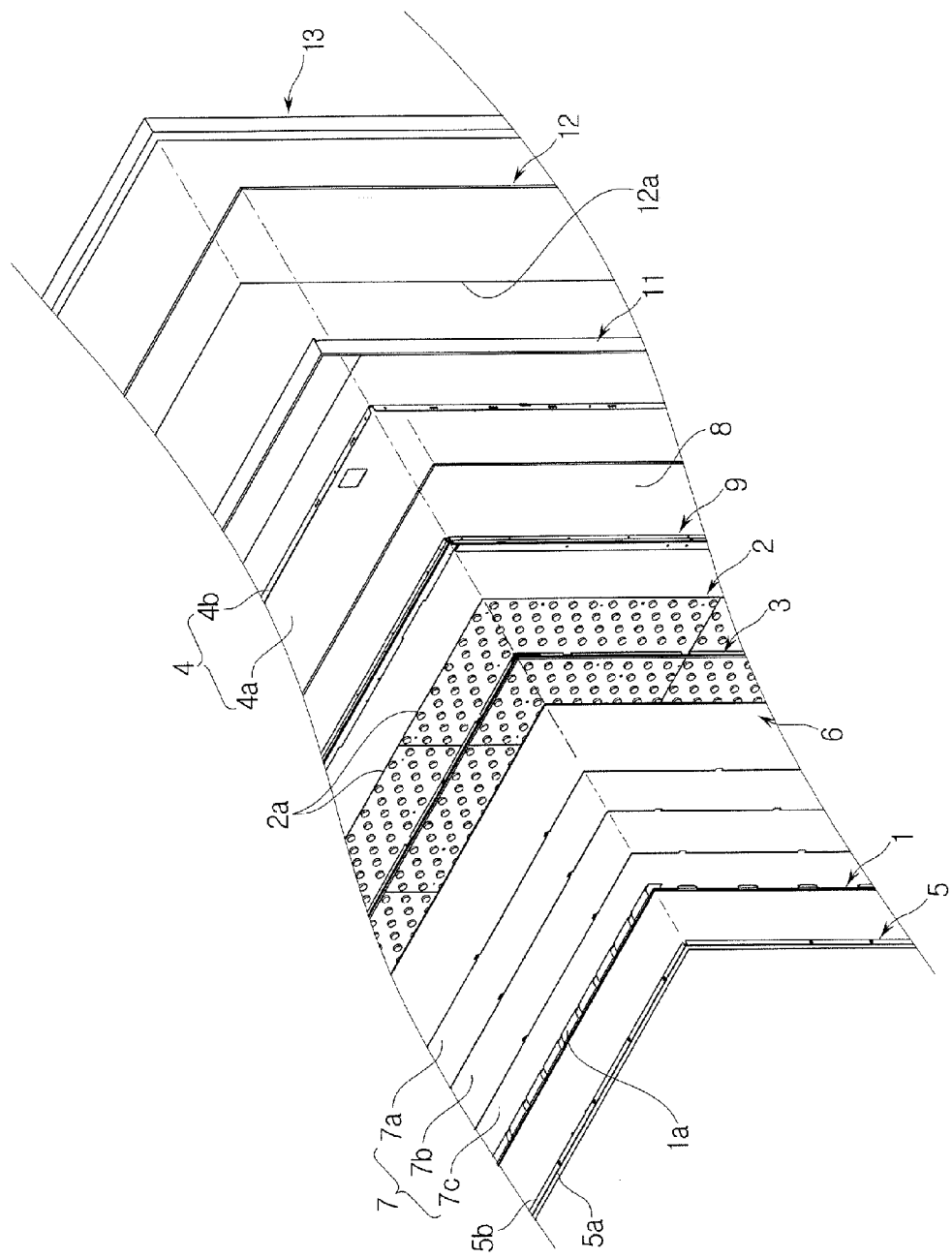
FIG. 5 is a partial perspective view of the display apparatus in accordance with one exemplary embodiment.
Figure 6:
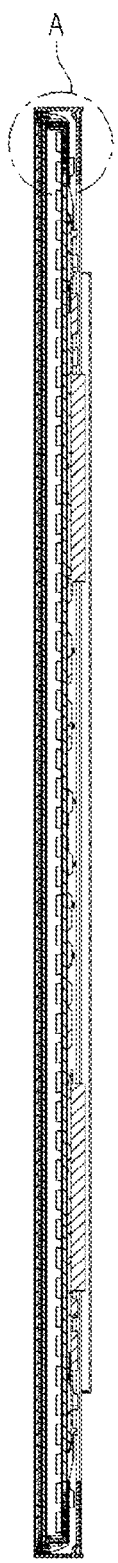
FIG. 6 is a cross-sectional view of the display apparatus in accordance with one exemplary embodiment.
Figure 7:
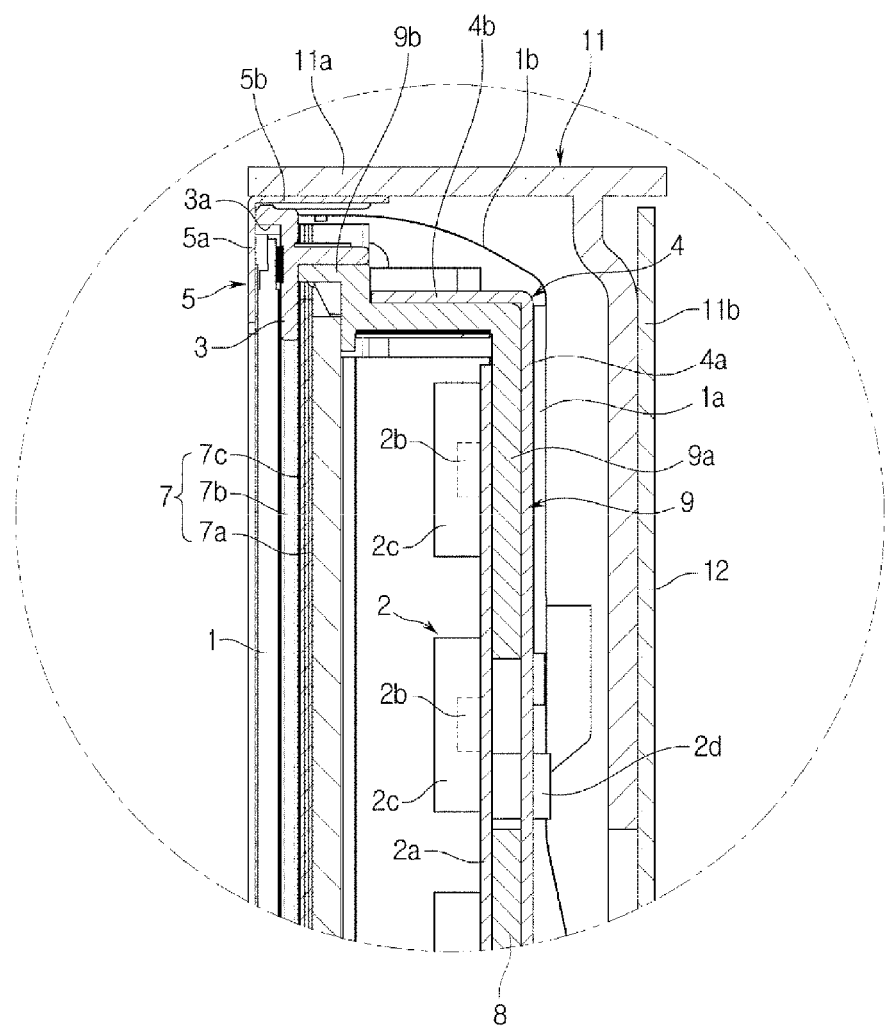
FIG. 7 is an enlarged view of a portion 'A' of FIG. 6.

Reference will now be made in detail to the exemplary embodiments, examples of which are illustrated in the accompanying drawings, wherein like reference numerals refer to like elements throughout.

As illustrated on FIGS. 1 to 7, a display apparatus in accordance with one exemplary embodiment includes a display panel 1 on which an image is displayed, a backlight 2 disposed at a rear side of the display panel 1 to radiate light to the display panel 1, a middle mold 3 to support the display panel 1, a top sash 5 configured to maintain the state of the display panel 1 being installed at the middle mold 3, and a bottom sash 4 configured to accommodate the backlight 2 at an inner side thereof and coupled to a rear side of the middle mold 3 through a supporting member 9 which is to be described later. In addition, a diffusing panel 6 configured to diffuse the light radiated from the backlight 2 and optical sheets 7 each configured to improve an optical characteristic of the light passed through the diffusing panel 6 are included in between the display panel 1 and the backlight 2.

The display panel 1 includes a liquid display panel, and includes a plurality of source printed circuit boards 1a connected through a flexible circuit boardg 1b extended from an upper portion of the display panel 1 and from a lower portion of the display panel 1.

The optical sheets 7 include a diffusing sheet 7a configured to diffuse the light again, passed through the diffusing panel 6, a prism sheet 7b having the pattern of a prism so that the light diffused by the diffusing sheet 7a may be collected in a perpendicular direction to the display panel 1 positioned at a front side, and a protective sheet 7c disposed at a front side of the prism sheet 7b to protect the prism sheet 7b, which is sensitive to a scratch from dust, etc.

The top chassis 5 is formed in the shape of a quadrangular ring, and includes a bezel part 5a configured to support a frontal edge of the display panel 1 and a top side part 5b which extends toward a rear side from an end portion of an outer side of the bezel part 5a, so as to be installed at the middle mold 3.

The middle mold 3 has an end portion of a rear side thereof coupled to a supporting member 9, which is to be described later, and is provided at a front side thereof with a panel installation part 3a at which the display panel 1 is installed.

The bottom chassis 4 includes a rear surface part 4a formed by bending a metallic panel such as aluminum to form a rear surface of the bottom chassis 4, and a bottom side surface part 4b which extends from an end portion of an outer side of the rear surface part 4a toward a front side so as to be installed at the supporting member 9, as described above.

In an exemplary embodiment, the backlight 2 includes printed circuit boards 2a formed in the shape of a plane panel, a plurality of light emitting diodes 2b mounted on the printed circuit boards 2a, a plurality of lenses 2c respectively installed at the plurality of light emitting diodes 2b, to diffuse the light generated from the plurality of light emitting diodes 2c, and a connector part 2d provided at a rear surface of the printed circuit board 2a and allowing the printed circuit board 2a to be connected to a backlight driving board 10e which is to be described later.

The backlight 2 includes the plurality of printed circuit boards 2a disposed in an even manner in left and right side directions, and in upper and lower side directions, and the plurality of light emitting diodes 2b are installed at each printed circuit board 2a. The backlights 2 each of whose size is smaller than that of the display panel 1, are provided to correspond to the large size of the display panel 1.

In an exemplary embodiment, the backlight 2 has five columns of the printed circuit boards 2a arranged in left and right side directions and two rows of the printed circuit boards 2a arranged in upper and lower side directions, and at each printed circuit board 2a, the plurality of light emitting diodes 2b are regularly arranged.

Thus, in a case when a display apparatus having a large size display panel 1 is manufactured, without having to manufacture the backlight 2 in large sizes, a plurality of general backlights may be disposed in upper and lower side directions and/or left and right side directions, so that a backlight 2 capable for large size display panel 1, may be provided.

At an inner surface of the rear surface 4a of the bottom chassis 4, a panel shaped member 8 formed in the shape of a quadrangular panel is disposed. The panel shaped member 8 is configured to perform a role to reinforce the strength of the bottom chassis 4, as well as a role to support a rear surface of the backlight 2, which is described above.

That is, the bottom chassis 4 is formed of a thin metallic panel as described above, and in a case when a display apparatus is to be increased in size, the size of the bottom chassis 4 is also increased, and thus, the bottom chassis 4 may be easily bent. As described above, by disposing the panel shaped member 8 at the inner side of the rear surface 4a of the bottom chassis 4, the panel shaped member 8 may support the inner surface of the rear surface 4a of the bottom chassis 4, so that the bending of the bottom chassis 4 may be prevented. That is, the panel shaped member 8 may be used as a reinforcing member to reinforce the strength of the bottom chassis 4.

In a case when the panel shaped member 8 is used as a reinforcing member, the panel shaped member 8 may be formed in a way that a honeycomb structure is formed in between a pair of aluminum plates, and when the panel shaped member 8 is formed in the honeycomb structure, the panel shaped member 8 is lightweight and yet is provided with great strength.

In addition, as described above, the backlight 2 is formed by disposing the plurality of printed circuit boards 2a in upper and lower side directions and in left and right side directions, and the panel shaped member 8 is provided in a way to support the rear surfaces of the printed circuit boards 2a which are evenly disposed in upper and lower side directions and in left and right side directions, so that the arrangement of the printed circuit boards 2a may be stably maintained by the panel shaped member 8.

In addition, when the panel shaped member 8 is formed of a material having superior heat conductivity, such as aluminum, the heat generated from the backlight 2 is delivered in a diffused manner to the bottom chassis 4 through the panel-shaped member 8, so that the heat generated from the backlight 2 may be discharged at a faster rate. Therefore, the panel shaped member 8 also operates as a heat-radiating member.

The panel shaped member 8 is formed in a way to have a vertical width smaller than those of the backlights 2, so that the connector 2d, which is described above, may be disposed at a rear surface of the backlight 2.

The supporting member 9 is disposed in between the bottom chassis 4 and the middle mold 3. The supporting member 9 is provided with middle mold 3 being installed at a front end portion thereof, and is provided with bottom chassis 4 being installed at a rear end portion thereof, so that the bottom chassis 4 and the middle mold 3 may be coupled to each other.

The supporting member 9 includes a backlight supporting part 9a provided at a rear side of the supporting member 9 in the same thickness as that of the panel shaped member 8 while disposed at a space in between the bottom chassis 4 and an upper end portion and a lower end portion of the backlight 2 as to support a periphery of the backlight 2 and a rear surface of the bottom chassis 4, and a diffusing panel installation part 9b provided at a front side of the supporting member 9 and coupled to the middle mold 3 so that the diffusing panel 6 is installed at an inner side of the diffusing panel installation part 9b.

Thus, the upper portion and lower portion of the backlight 2 are supported by the bottom chassis 4 through the backlight supporting part 9a of the supporting member 9, and the remaining portion of the backlight 2 is supported by the bottom chassis 4 through the panel shaped member 8.

In addition, at the diffusing panel installation part 9b of the supporting member 7, the diffusing sheet 7a, the prism sheet 7b, and the protective sheet 7c, all of which are described above, are installed along with the diffusing panel 6 inside the diffusing panel installation part 9b, so that the optical sheets 7 are supported by the supporting member 9.

Figure 8:
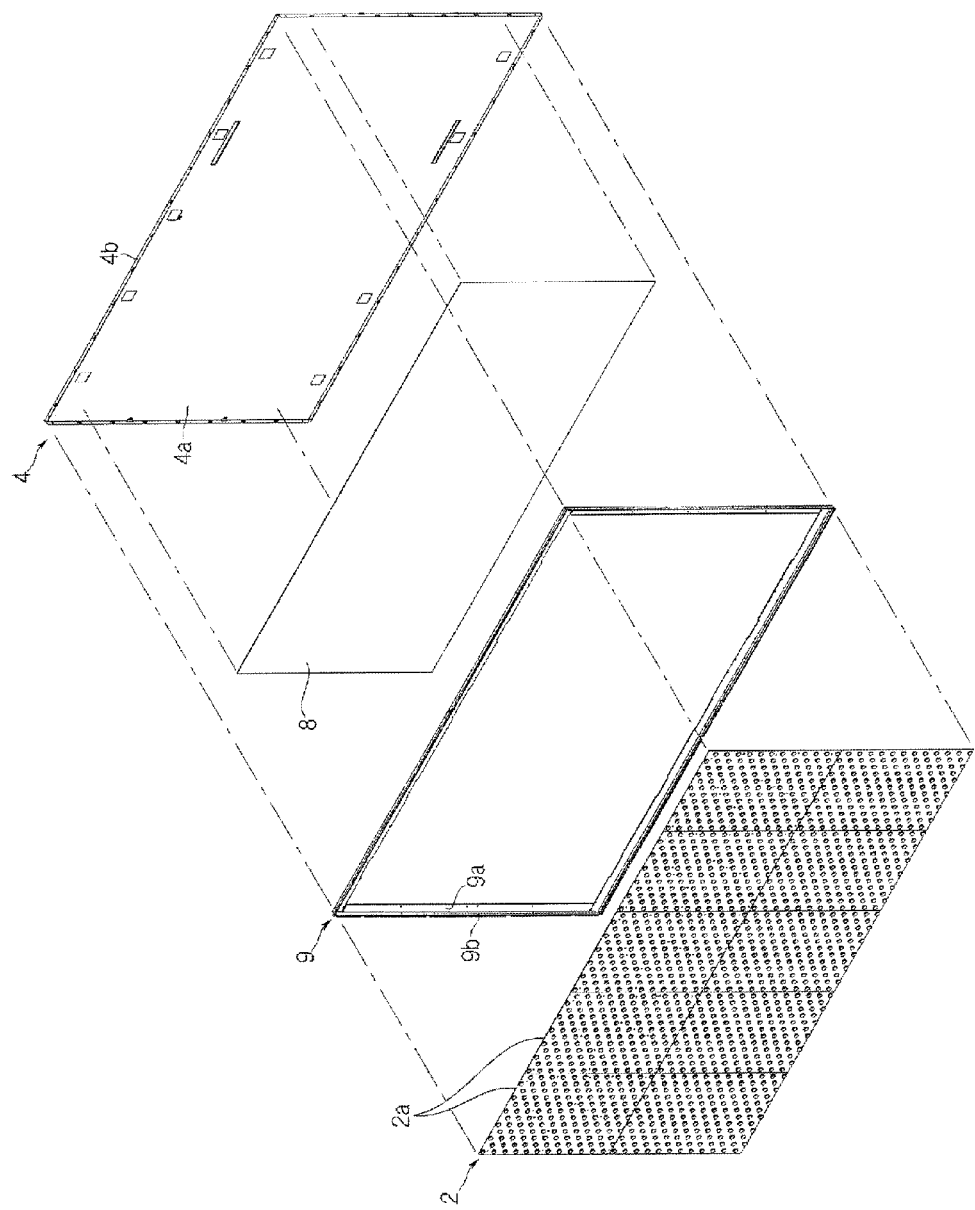
FIGS. 8 to 11 are perspective views, with respect to the display apparatus in accordance with one exemplary embodiment, sequentially showing an installation process of a panel shaped member, a supporting member, a backlight and a middle mold being installed at a bottom chassis.
Figure 9:
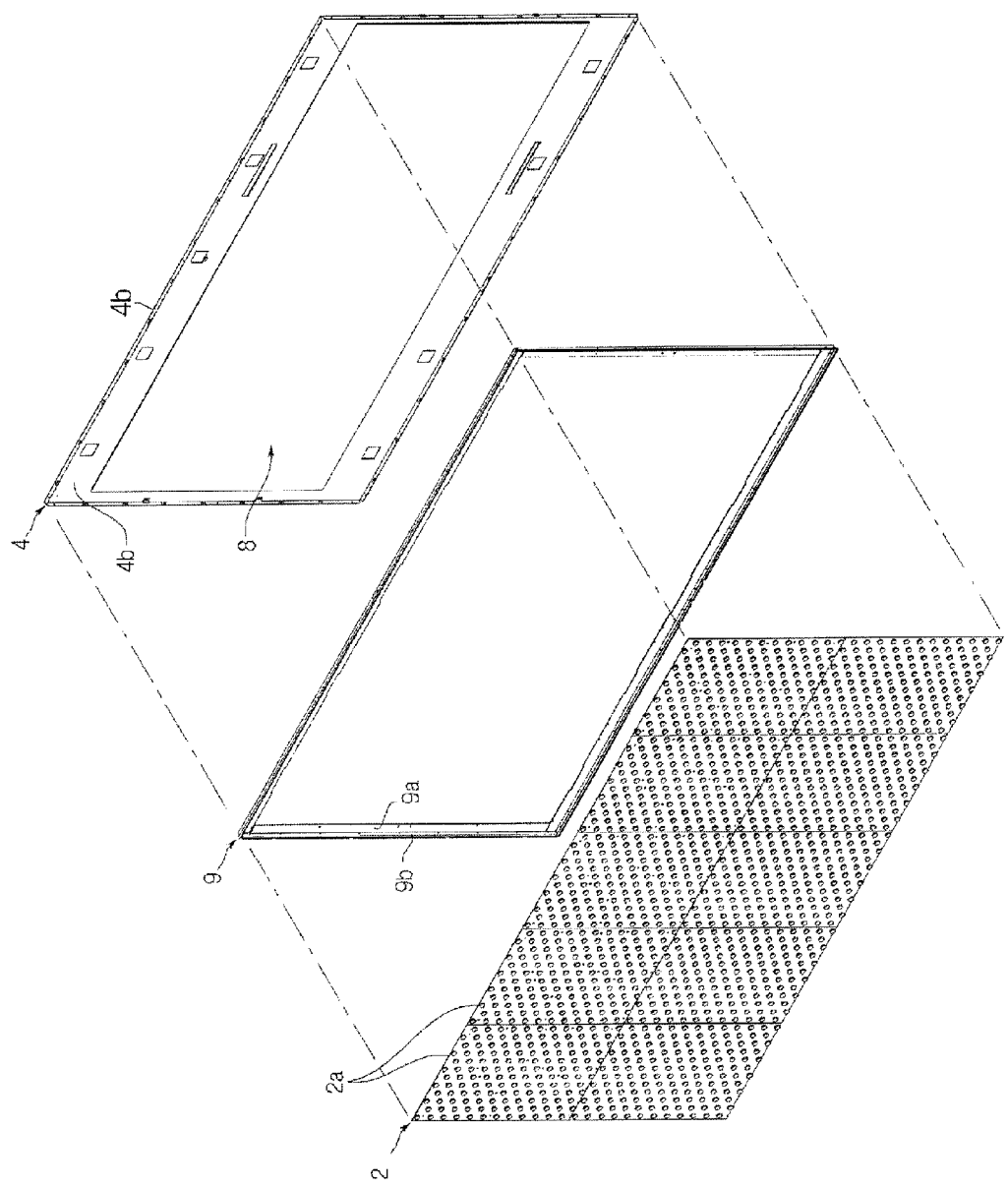
Figure 10:
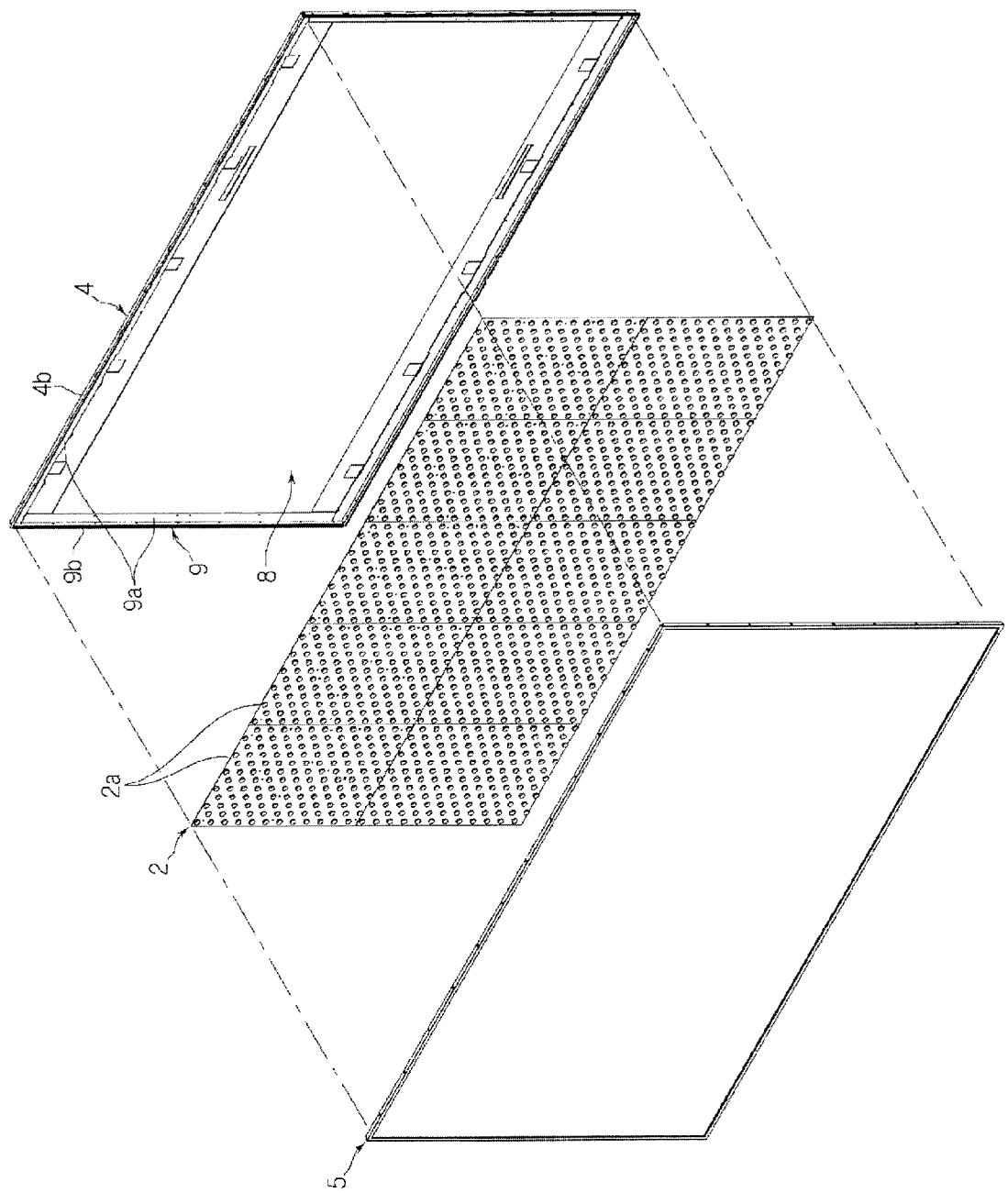
Figure 11:
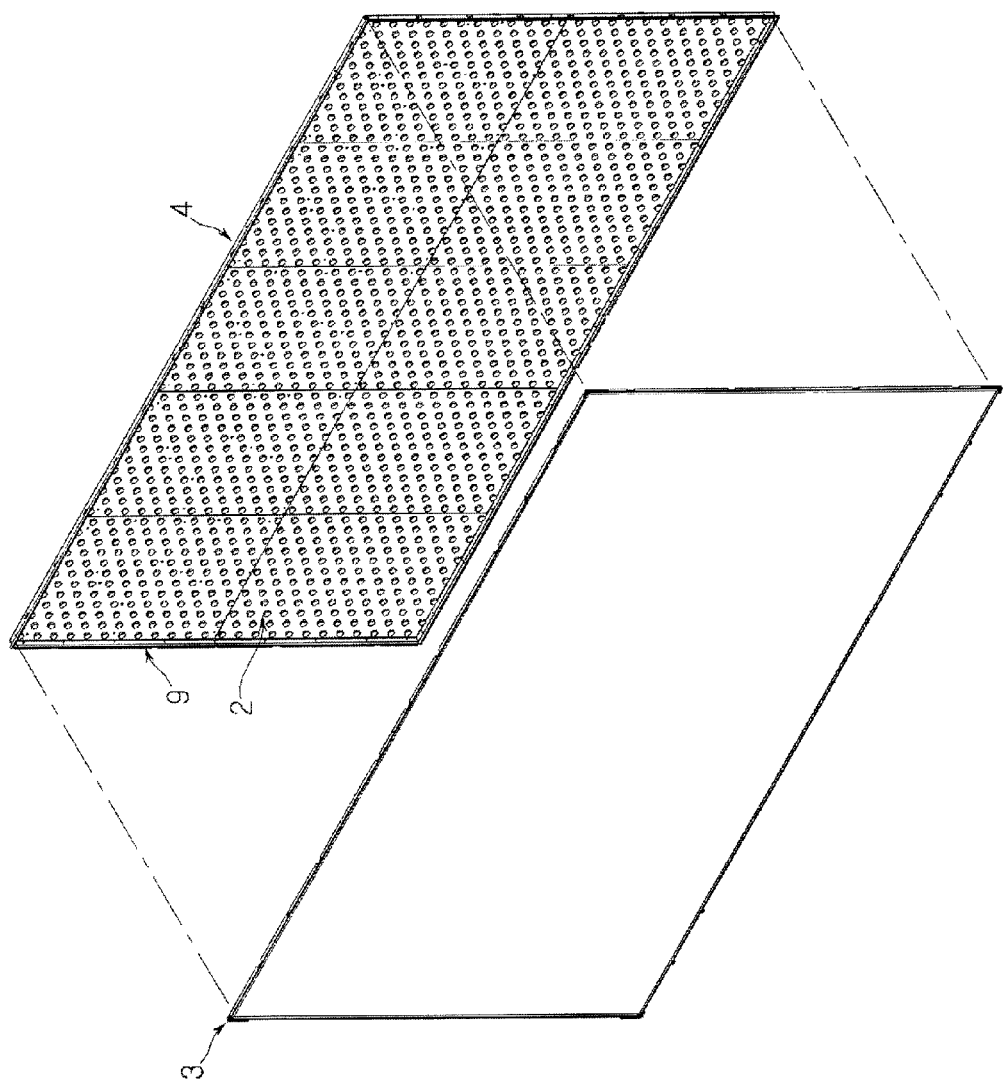

In FIGS. 8 to 10, an installation process of the backlight is sequentially illustrated.

As illustrated on FIG. 8 and FIG. 9, at the bottom chassis 4, the panel shaped member 8 is installed, and as illustrated on FIG. 10, at the bottom chassis 4 at which the panel shaped member 8 is installed, the supporting member 9 is installed, so that the panel shaped member 8 and a front surface of the backlight supporting part 9a are positioned on the same plane surface at a front side of the rear surface part 4b of the bottom chassis 4.

In such the state, as illustrated on FIG. 10, as the backlight 2 is installed inside the bottom chassis 4 through a method such as attaching. The periphery of a rear surface of the backlight 2 is supported by the backlight supporting unit 9a, and the remaining portion of the rear surface of the backlight 2 is supported by the panel shaped panel 8. Thus, the plurality of printed circuit boards 2a forming the backlight 2 may be able to maintain a state of being stably installed at the panel shaped member 8 and the supporting member 9.

In addition, at a rear surface of the bottom chassis 4, various boards 10, which are configured to control the display apparatus, are installed. The boards 10 include a power source board 10a connected to an external power source to supply power to the display apparatus, a signal processing board 10b configured to process various image signals and acoustic signals, panel driving boards 10c and 10d to control driving of the display panel 1, and a backlight driving board 10e to control driving of the backlight 2.

In an exemplary embodiment, the panel driving boards 10c and 10d are provided in a pair, and are disposed as one panel driving board for each of an upper portion and a lower portion of the backlight driving board 10e, so that the panel driving board 10c disposed at the upper portion may control a driving of an upper domain of the display panel 1, and the panel driving board 10d disposed at a lower portion may control driving of a lower domain of the display panel 1.

As the size of the display panel 1 is increased, the driving of an entire domain of the display panel 1 may not be able to be controlled by a single panel driving board Thus, the pair of the panel driving boards is provided to correspond to an increased size of the display panel 1.

In addition, the backlight driving panel 10e is disposed at a center of a rear surface of the bottom sash 4, the panel driving boards 10c and 10d that are described above are disposed at an upper side and at a lower side of the backlight driving board 10e, the power source board 10a is disposed at one side of the backlight driving board 10e, and the signal processing board 10b is disposed at the other side of the backlight driving board 10e.

In addition, the display apparatus includes a side surface case 11 formed in the shape of a quadrangular ring and covering upper sides and lower sides, as well as left and right sides of the bottom chassis 4 and the top chassis 5 to form the sides of the display apparatus, a rear surface case 12 installed in a way so as to cover a rear side of the side surface case 11 and having an opening 12a which allows the printed circuit board 2a to be exposed there through, and a rear surface cover 13 detachably installed at the opening 12a.

The side surface case 11 includes a side surface covering part 11a forming the four side surfaces of upper, lower, left, and right sides, and a board covering part 11b extended in parallel to the bottom chassis 4 from a rear end of the side surface covering part 11a, downward to cover and hide a source printed circuit board 1a.

In an exemplary embodiment, the side surface case 11 is separately formed from the rear surface case 12, but the exemplary embodiments are not limited hereto, and forming the side surface case and the rear surface case as a single member may be possible.

In an exemplary embodiment, the panel shaped member 8 is configured to perform a role as a heat radiating member, but is not limited hereto, and the panel shaped member 8 may be able to perform a role as a heat insulating member, configured to prevent the heat generated from the boards installed at a rear side of the bottom chassis from being delivered to the display panel positioned at a front side of the display apparatus.

In an exemplary embodiment, the panel driving boards 10c and 10d include one pair of panel driving boards 10c and 10d disposed in a longitudinal direction, to drive an upper portion of the display panel 1 and a lower portion of the display panel 1, respectively, but are not limited hereto. For example, the two panel driving boards 10c and 10d may be configured to separately drive a left portion of the display panel from a right portion of the display panel.

In addition, more than two panel driving boards are provided, so that the display panel 1 is divided by the more than two panel driving boards into more than two domains that are driven separately from one another.

Although a few exemplary embodiments have been shown and described, it would be appreciated by those skilled in the art that changes may be made in these exemplary embodiments without departing from the principles and spirit of the disclosure, the scope of which is defined in the claims and their equivalents.

What is claimed is:

1. A display apparatus, comprising:
a display panel,
a backlight configured to radiate to the display panel,
a bottom chassis configured to accommodate the backlight, and
a plurality of panel driving boards disposed at a rear surface of the bottom chassis,
a backlight driving board configured to control driving of the backlight,
wherein each of the plurality of panel driving boards controls a respective one of a plurality of portions of the display panel,
wherein the plurality of panel driving boards comprises a pair of panel driving board, each disposed at one of an upper portion and a lower portion of the rear surface of the bottom chassis, and
wherein each of the pair of panel driving boards is disposed at one of an upper portion and a lower portion of the backlight driving board.

2. The display apparatus of claim 1, further comprising:
a power supplying board disposed at one side of the backlight driving board, and
a signal processing board disposed at another side of the backlight driving board.

3. The display apparatus of claim 1,
wherein the backlight comprises a plurality of printed circuit boards disposed in an even manner, and a plurality of light emitting diodes mounted on the plurality of printed circuit boards.

4. The display apparatus of claim 3, wherein:
the plurality of printed circuit boards are provided in a plurality of rows arranged left and right side directions and a plurality of columns arranged in upper and lower side directions.

5. The display apparatus of claim 3, further comprising:
a panel shaped member configured to support rear surfaces of the plurality of printed circuit boards.

6. The display apparatus of claim 5, wherein:
the panel shaped member has a honeycomb structure formed between a pair of aluminum panels.

7. A display apparatus, comprising:
a display panel,
a backlight configured to radiate light to the display panel,
a bottom chassis configured to accommodate the backlight,
a plurality of panel driving boards disposed at a rear surface of the bottom chassis,
a panel shaped member configured to support rear surfaces of the plurality of printed circuit boards,
a middle mold configured to support the display panel, and
a supporting member disposed between the middle mold and the bottom chassis,
wherein each of the plurality of panel driving boards controls a respective one of a plurality of portions of the display panel,
wherein the backlight comprises a plurality of printed circuit boards disposed in an even manner, and a plurality of light emitting diodes mounted on the plurality of printed circuit boards, and
wherein the supporting member comprises a backlight supporting part having a thickness which is the same as a thickness of the panel shaped member and disposed between a periphery of the backlight and the bottom chassis.

8. The display apparatus of claim 7, further comprising:
a top chassis configured to maintain the display panel in a state of being installed at the middle mold,
a side surface case having a quadrangular ring shape and provided to cover upper and lower sides and left and right sides of the bottom chassis and the top chassis, and
a rear surface case provided to cover a rear side of the side surface case.

* * * * *